United States Patent [19]
Oda

[11] Patent Number: 5,472,890
[45] Date of Patent: Dec. 5, 1995

[54] METHOD FOR FABRICATING AN INSULATING GATE FIELD EFFECT TRANSISTOR

[75] Inventor: Noriaki Oda, Tokyo, Japan

[73] Assignee: NEC Corporation, Tokyo, Japan

[21] Appl. No.: 427,816

[22] Filed: Apr. 26, 1995

[30] Foreign Application Priority Data

Apr. 28, 1994 [JP] Japan .................. 5-090882

[51] Int. Cl.⁶ .............................. H01L 21/336
[52] U.S. Cl. ................ 437/41; 437/44; 437/235; 437/236; 748/DIG. 113
[58] Field of Search .............. 437/44, 235, 236, 437/41 SW, 41 RLD; 748/DIG. 113; 257/336, 408, 759

[56] References Cited

U.S. PATENT DOCUMENTS

| | | | |
|---|---|---|---|
| 4,753,898 | 6/1988 | Parrillo et al. | 437/44 |
| 4,769,686 | 9/1988 | Horiuchi et al. | 257/373 |
| 4,776,922 | 10/1988 | Bhattacharyya et al. | 156/643 |
| 4,838,991 | 6/1989 | Cote | 156/643 |
| 4,924,279 | 5/1990 | Shimbo | 257/58 |
| 5,081,559 | 1/1992 | Fazan et al. | 361/313 |
| 5,166,096 | 11/1992 | Cote et al. | 437/195 |
| 5,324,690 | 6/1994 | Gelatos et al. | 437/236 |

FOREIGN PATENT DOCUMENTS

| | | | |
|---|---|---|---|
| 502614A2 | 9/1992 | European Pat. Off. | 257/759 |
| 62-147776 | 7/1987 | Japan . | |
| 2-270335 | 11/1990 | Japan . | |

OTHER PUBLICATIONS

Pfiester, J. R., "LDD MOSFET's Using Disposable Sidewall Spacer Technology", IEEE Elec. Dev. Lett., vol. 9, No. 4, Apr. 1988, pp. 189–192.

"Copper Multilevel Interconnections", IBM Tech. Disc. Bull., vol. 33, No. 11, Apr. 1991, pp. 299–300.

Primary Examiner—T. N. Quach
Attorney, Agent, or Firm—Young & Thompson

[57] ABSTRACT

A LDD MOS transistor having a small fringe capacitance is fabricated by the steps of forming, lightly-doped source and drain regions by introducing impurities into a semiconductor substrate by using gate electrode as a mask, forming a pair of sidewall spacers above side surfaces of the gate electrode, forming heavily doped source and drain regions by an ion implantation method using the pair of sidewall spacers as a mask, removing the pair of sidewall spacers, and forming a pair of new sidewall spacers having a dielectric constant lower than that of silicon oxide above the side surface of the gate electrode, including the use of polyimide or boron nitride as the spacer material.

10 Claims, 4 Drawing Sheets

METHOD FOR FABRICATING AN INSULATING GATE FIELD EFFECT TRANSISTOR

BACKGROUND OF THE INVENTION

1. Field of the Invention

The present invention relates to a method for fabricating an insulating gate field effect transistor such as an MOS transistor suppressing the so-called short channel effect.

2. Description of the Related Art

As one of means for improving the performance of an MOS transistor, it is well known to make the channel length thereof short. In accordance with shortening in channel length, however, the electric field applied near the drain region of the transistor becomes stronger because of an abrupt impurity profile thereof. In order to reduce the electric field, therefor, such an MOS transistor that has a lightly doped drain (LDD) structure have been proposed and put into practical use.

Referring to FIGS. 3(a) to 3(c), such an LDD transistor is fabricated as follows:

First, a field oxide film 202 and a gate oxide film 203 are formed by the thermal oxidation of an element isolation region and an element formation region, respectively, of a P-type silicon substrate 201 having an impurity concentration of about $10^{15}$ cm$^{-3}$. After implantation of boron ions for threshold voltage adjustment under conditions of, for example, 35 keV and $4\times10^{12}$ cm$^{-2}$, a 300 nm-thick polycrystalline silicon film is formed over the entire surface by the chemical vapor deposition (CVD) method and then diffused with phosphorus impurities, followed by patterning to form a gate electrode 204. Phosphorus ions are implanted at, for example, 20 keV and $7\times10^{13}$ cm$^{-2}$ in a self-alignment manner with the gate electrode 204 and the field oxide film 202 to form N$^-$-type lightly-doped layers 205a and 205b having an impurity concentration of about $10^{18}$ cm$^{-3}$. A silicon oxide film 206 with thickness of about 150 nm is then formed allover the surface by the CVD method (FIG. 3(a)).

Next, as shown in FIG. 3(b), the silicon oxide film 206 is etched back by the anisotropic reactive ion etching (RIE) method to leave and thus form silicon sidewall spacers 206a on the both side of the gate electrode 204. Arsenic ions are implanted at, for example, 70 keV and $3\times10^{15}$ cm$^{-2}$ in a self-alignment manner with the silicon oxide spacers 206a, the gate electrode 204 and the field oxide film 202 to thereby form highly-doped N$^+$-type diffused layers 207a and 207b having an impurity concentration of about $1\times10^{19}$ cm$^{-3}$ In this way, a source region 208 consisting of the N$^-$-type diffused layer 205a and the N$^-$-type diffused layer 207a, and a drain region 209 consisting of the N$^-$-type diffused layer 205b and the N$^-$-type diffused layer 207b, are formed.

Following that, as shown in FIG. 3(c), a silicon oxide film 210 with thickness of about 100 nm is formed on the entire surface by the CVD method. Then, a BPSG film with thickness of about 700 nm is formed on the entire surface by a atmospheric pressure chemical vapor deposition (APCVD) which uses tetraethoxysilane (Si(OC$_2$H$_5$)$_4$; TEOS) gas, ozone (O$_3$) gas, trimethylphosphate (PO(OCH$_3$)$_3$; TMP) gas, and trimethylborate (B(OCH$_3$)$_3$; TMB) gas as source gases and further a spin-on-glass (SOG) film (not shown) is formed on the entire surface. The silicon oxide film is etched back until the SOG film is removed completely to thereby form a BPSG film 211 having a flat top surface. Contact openings which reach respectively the source region 208 and the drain region 209 are formed by RIE by sequential etching of the BPSG film 211 and the silicon oxide film 210. A titanium film 212 with thickness of about 60 nm and a titanium nitride film 213 with thickness of about 100 nm are formed on the entire surface by sputtering and reactive sputtering, respectively. Further, the surface is blanketed with a tungsten film having a thickness of about 500 nm, and the tungsten film is etched back leaving a tungsten film 214 within the contact openings. Then, an aluminum film 215 with thickness of, for example, about 500 nm is formed by sputtering and then patterned to form metallic wirings each composed of the aluminum film 215, the titanium nitride film 213 and the titanium film 212. Next, an inter-layer insulating film 216 is formed on the entire surface. Thus, the LDD MOS transistor is derived.

Although the LDD MOS transistor presents an improved performance, in order to further enhance the device performance, the reduction in the parasitic or stray capacity of the MOS transistor itself becomes also important. The MOS transistor inherently has the stray capacitances between the gate and channel and between the gate and source/drain. In the LDD structure, however, each of the gate length (L) and the gate width (W) is reduced and further the lightly-doped regions 205 is suppressed to extend laterally. Therefore, the overlap capacitance between the gate electrode and the channel region is decreased.

However, the decrease in the overlap capacitance causes in turn the rate of the so-called fringe capacitance to increase. The fringe capacitance is formed between the gate electrode and the source/drain region due to the fringe electric fields between the sides of the gate electrode and the source/drain region. That is, the fringe capacitance becomes in turn one of major factors influencing the operating speed of the transistor.

For example, in the transistor shown in FIG. 3, the fringe capacity between the gate electrode and the drain region is about 1.24 fF, for L=0.5 μm and W=10 μm. When this transistor is employed to constitute a CMOS inverter together with a P-channel transistor with L=0.5 μm and W=15 μm, the delay time of the inverter becomes the order of 100 ps.

In order to reduce the fringe capacitance, therefore, it may be considered that the inter-layer insulating film 211 is replaced with a polyimide film having a low dielectric constant. In this case, however, the polyimide layer generates an organic gas upon sputtering the metal film 212, so that many voids in the metal layer.

It may be further considered that the silicon oxide side spacer 206 is replaced with a low dielectric film such as polyimide. In that case, a polyimide film is deposited over the entire surface in place of the oxide film 206 and then etched back to form a polyimide side spacer, followed by forming the regions 207a and 207b. However, the polyimide space hardly operates as a mask for selective ion-implantation, so that undesirably large highly-doped regions are formed. Moreover, it is not easy to control the width of the polyimide spacer.

SUMMARY OF THE INVENTION

Therefore, an object of this invention is to provide an improved method for fabricating an MOS transistor having a low fringe capacitance.

It is another object of the present invention to provide a method for fabricating an MOS transistor with lowered stray or parasitic capacitance in both overlapping and fringe capacitances.

A method of fabricating a transistor according to this invention is characterized in that side spacers used as a mask for forming highly-doped regions by ion-implantation is removed and thereafter a low dielectric insulation layer such as polyimide or boron nitride is deposited over the entire surface and then etched back to form new side spacers made of the low dielectric layer.

With the above-featured method, the highly-doped regions are formed in a desired pattern and the fringe capacitance is lowered by the new side spacers.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
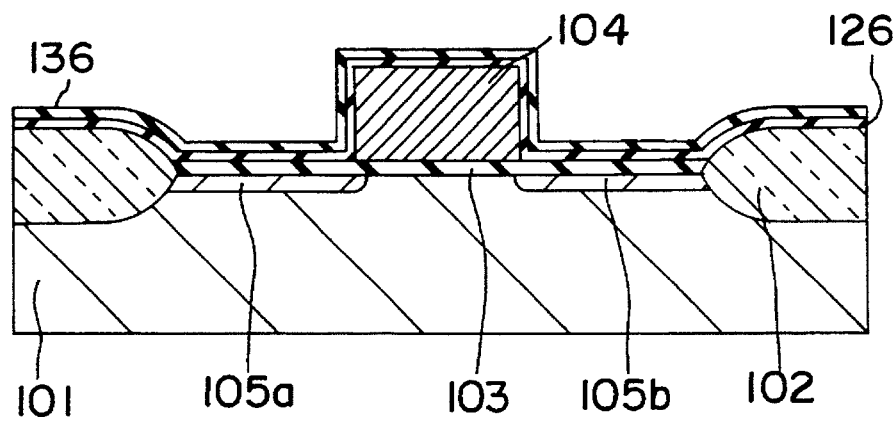
FIG. 1(a) to FIG. 1(f) are the cross sectional views illustrative of respective steps of a method according to first embodiment of the invention.

Referring now to FIG. 1, in the first step as shown FIG. 1(a) of a method according to the first embodiment of this invention, a P-type silicon substrate is first selectively oxidized by the so-called LOCOS process to form a field oxide film 102. This film 102 is formed on an element isolation region of the substrate 101 surrounding an element formation regions thereof. The substrate has an impiurity concentration of about $10^{15}$ cm$^{-3}$. The element formation region is then thermal-oxidized to form a gate oxide film 103. The implantation of boron ions is carried out for threshold voltage adjustment under the conditions of, for example, 35 keV and $4 \times 10^{12}$ cm$^{-2}$. A 300 nm-thick polycrystalline silicon film is then formed over the entire surface by the CVD method and diffused with phosphorus impurities, followed by patterning to form a gate electrode 104. Then, lightly doped layers 105a and 105b having an impurity concentration of about $10^{18}$ cm$^{-3}$ are formed by an phosphorus implantation at, for example, 20 keV and $7 \times 10^{13}$ cm$^{-2}$ in a self-alignment manner with the gate electrode 104 and the field oxide film 102. A silicon oxide film 126 with thickness of about 10 nm and a silicon nitride film 136 with thickness of about 10 nm are then formed sequentially on the entire surface by the low pressure chemical vapor deposition (LPCVD). These films have an excellent step coverage and give only a slight damage to the silicon substrate 101.

Figure 1B:
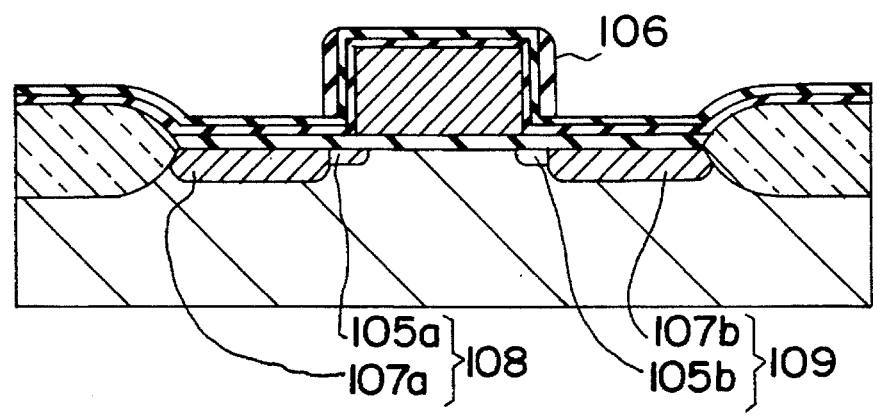
Figure 1C:
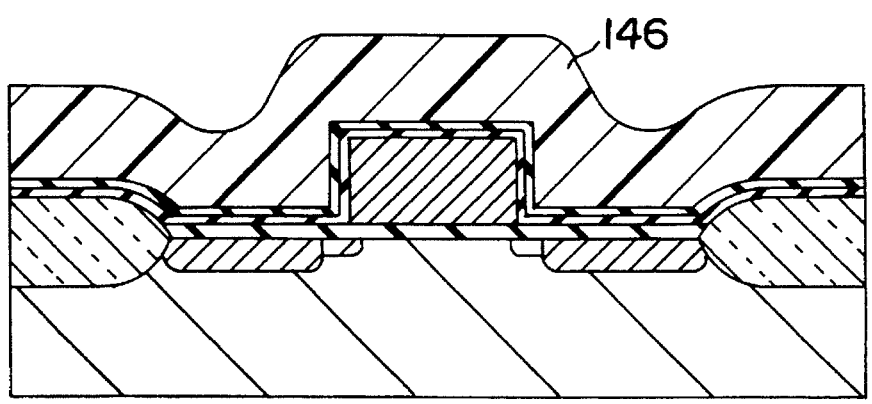
Figure 1D:
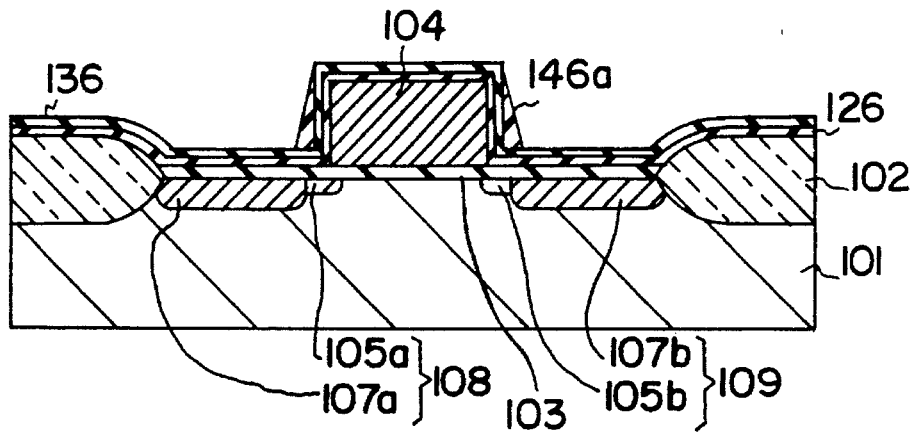
Figure 1E:
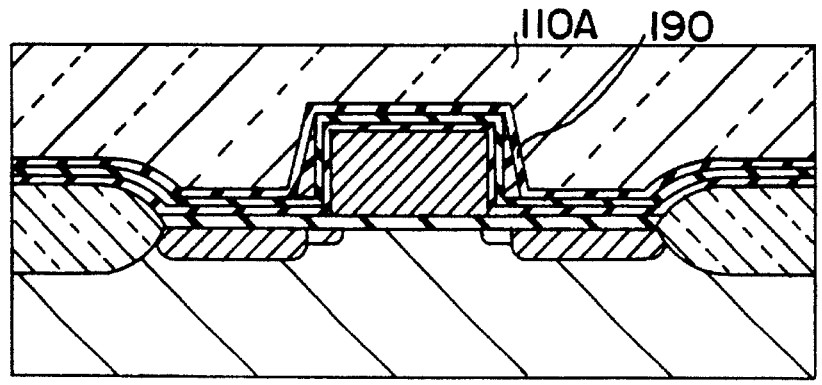
Figure 1F:
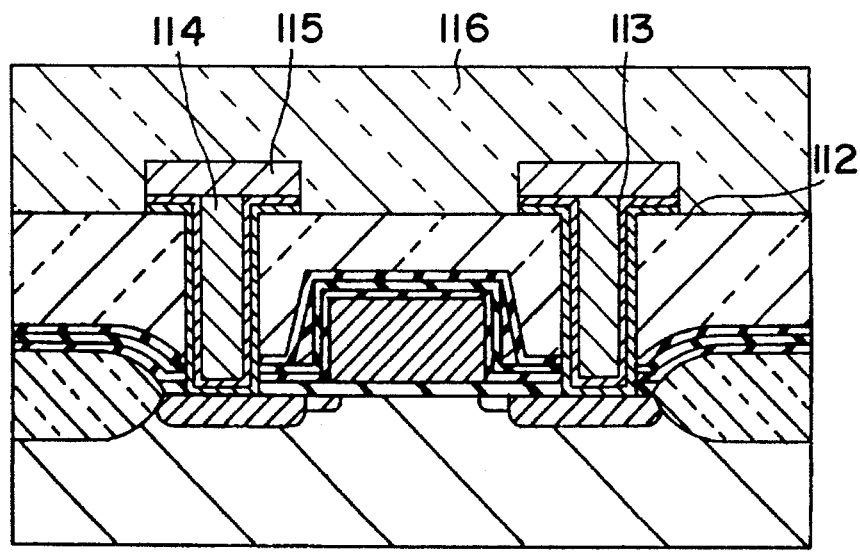

Next, a silicon oxide film (not shown) with thickness of about 150 nm is formed on the entire surface by the LPCVD or the plasma-enhanced CVD (PECVD). Next, as shown in FIG. 1(b), silicon oxide sidewall spacers 106 as first spacers are formed on the both side faces of the gate electrode by etching back the silicon oxide film by the RIE at the pressure of 7 Pa and the RF power of 600 W using 50 sccm trifluoromethane (CHF$_3$) gas and 150 sccm carbon monoxide (CO) gas. In this etching back, the selectivity ratio for the etching of the silicon oxide film to the silicon nitride film is high (about 5), so that the silicon nitride film 136 functions as an etching stopper. Further, the silicon oxide film 126 has the function of relaxing the stress of the silicon nitride film 136 at the part covering the gate electrode 104.

Following that, arsenic ions are implantation at, for example, 70 keV and $3 \times 10^{15}$ cm$^{-2}$ in a self-alignment manner with the silicon oxide spacers 106, the silicon oxide film 126 and the silicon nitride film 136, the gate electrode 104, and the field oxide film 102 to thereby form highly-doped N$^+$-type layers 107a and 107b having an impurity concentration of about $1 \times 10^{19}$ cm$^{-3}$. In this way, the N$^-$-type diffused layer 105a and the N$^+$-type diffused layer 107a constitutes a source region, and the N$^-$-type diffused layer 105b and the N$^+$-type diffused layer 107b constitutes a drain region.

Next, the silicon oxide spacers 106 are selectively removed by an isotropic etching using, for example, buffered hydrofluoric acid. In this case, the silicon nitride film 136 functions also as an etching stopper. Therefore, no damages are applied to the gate oxide film 103. Following that, a polyimide film 146 having a thickness of about 200 nm is formed on the entire surface by a spin coating then it is heated at 400° C. for 30 min. (FIG. 1(c)).

Next, the polyimide film 146 is etched back by an oxygen plasma to form the polyimide sidewall spacers 146a. At this time, the silicon nitride film 136 serves as an etching stopper. Although the maximum width of the polyimide sidewall spacer which covers over the source region 108 and the drain region 109 depends on the controllability of this etching, it is possible to restrict its width within the range of 200±50 nm (FIG. 1(d)).

Next, a second silicon nitride film 190 with thickness of about 10 nm is formed by PECVD using monosilane (SiH$_4$) gas and ammonia (NH$_3$) gas as a source gas at a temperature below 500° C. to protect the highly hygroscopic polyimide spacers 146a. Subsequently, a BPSG film with thickness of about 700 nm is formed on the entire surface at a temperature below 500° C. by the APCVD using, for example, TEOS gas, ozone gas, TMP gas, and TMB gas as the source gases, and further an SOG film (not shown) is formed on the entire surface. The SOG and BPSG films are then etched back until the SOG film is removed completely, so that a BPSG film 110A with flat top surface is formed as an inter-layer insulating film (FIG. 1(e)).

Next, contact openings reaching the respective parts of the source region 108 and the drain region 109 are formed by RIE by sequentially etching the insulating layer 110A, the silicon nitride film 136, the silicon oxide film 126, and the gate oxide film 103. Then, a titanium film 112 with thickness of about 60 nm and a titanium nitride film 113 with thickness of about 100 nm are formed on the entire surface by a sputtering and a reactive sputtering, respectively. Further, a tungsten is deposited on the entire surface to form a blanket tungsten film with thickness of about 500 nm. This blanket tungsten film is then etched back to thereby form tungsten plugs 114 filling the respective the contact openings. Then, for example, an aluminum film, an aluminum alloy layer such as Al—Si, Al—Si—Cu, Al—Ge or the like, or a copper film with thickness of about 500 nm is formed by a sputtering and then patterned to form metallic wirings each composed of the aluminum film 115, the titanium nitride film 113, and the titanium film 112. Next, as inter-layer film 116 is further formed on the entire surface FIG. 1(f). Thus, the LDD transistor is derived.

Figure 3A:
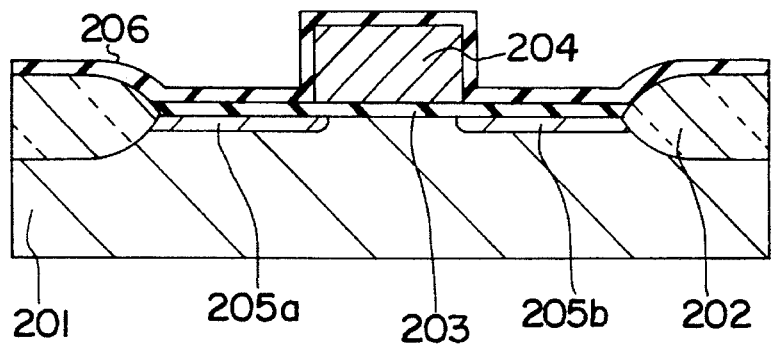
FIG. 3(a) to FIG. 3(c) are the sectional views illustrative of respective steps of a method according to the prior art.
Figure 3B:
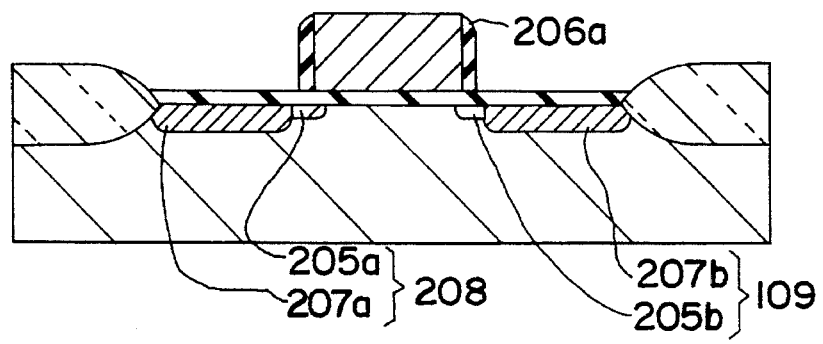
Figure 3C:
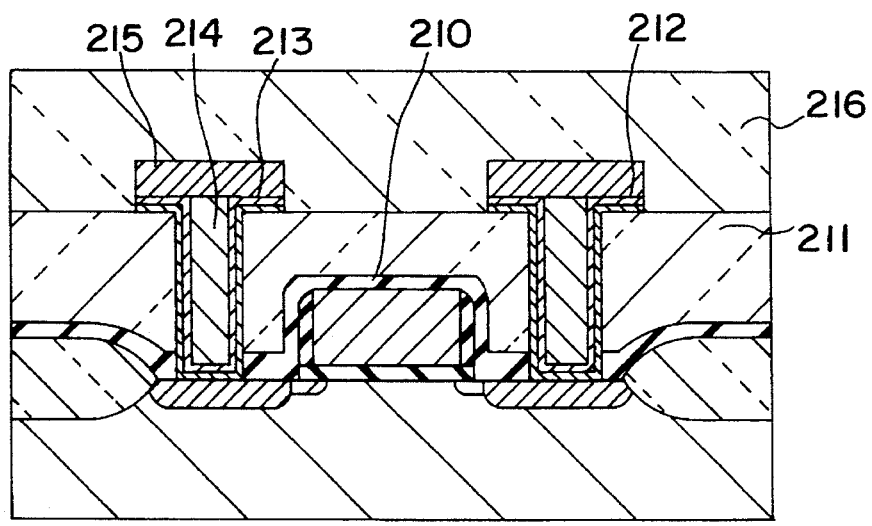

A significant difference of the first embodiment from the conventional LDD transistor is the presence of the polyimide sidewall spacers 146a in place of the silicon oxide sidewall spacers. Because of this, in a case of the field-effect transistors of L=0.5 μm and W=10 μm, by formed by the method mentioned above the fluctuations in the transistor characteristics themselves are made small even when the maximum fluctuation width of the polyimide spacers is taken into consideration. The fringe capacity between the gate electrode and the drain region is smaller about 15% than that of the conventional LDD transistor as shown in FIG. 3(c). When this transistor is employed to constitute a CMOS inverter together with a P-channel transistor with L=0.5 μm and W=15 μm, the delay time of the inverter is reduced by about 10% compared with the conventional LDD transistor.

Figure 2:
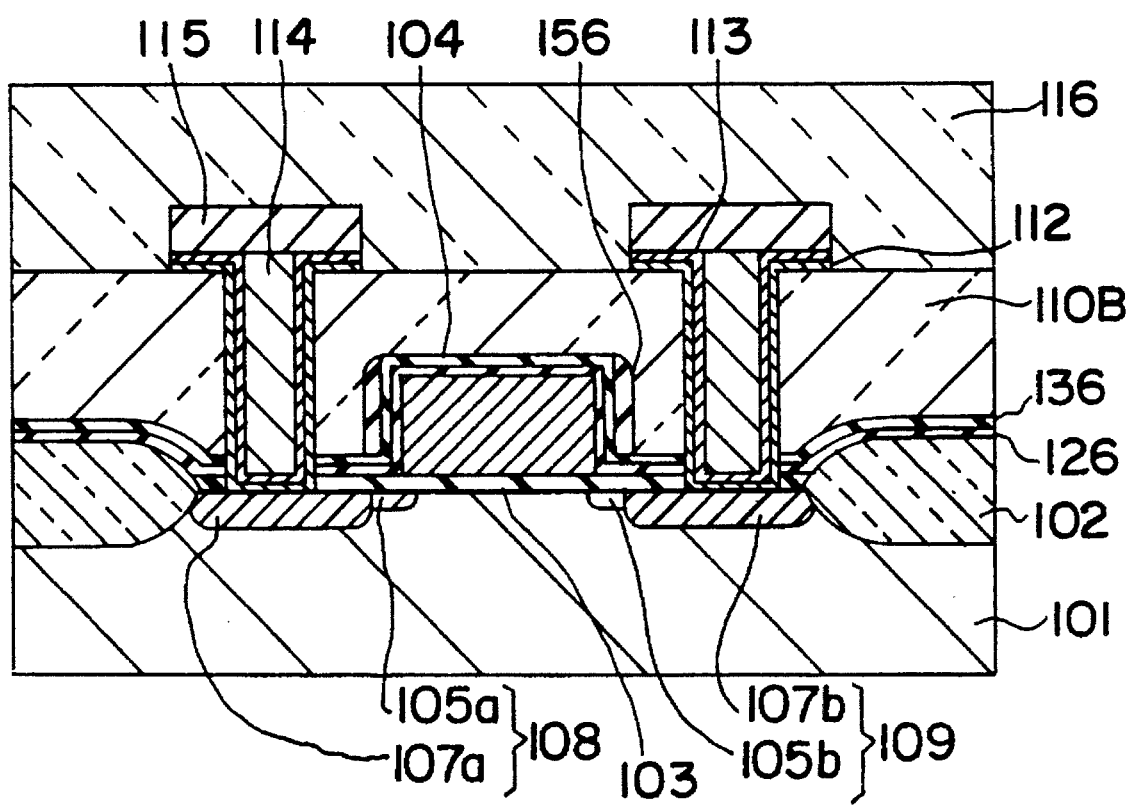
FIG. 2 is a sectional view illustrate of a MOD transistor fabricated by a method according to second embodiment of the invention.

Turning to FIG. 2, there is shown an LDD transistor according to the second embodiment of this invention in which the same constituents as those shown in FIG. 1 are denoted by the same reference numerals to omit the further description thereof. In this embodiment, boron nitride spacers 156 are employed in place of the polyimide sidewall spacers 146 as shown in FIG. 1. Further an undoped silicon oxide film 110B is employed in place of the BPSG film.

The formation of the boron nitride spacers 156 is done in the following way. Up to the steps of the formation of the $N^+$-type higher doped layers 107a and 107b and the removal of the first sidewall spacers composed of a silicon oxide film, this embodiment follows the same method as in the first embodiment. Then, a boron nitride film with thickness of about 200 nm is formed by the PECVD using diboron ($B_2H_6$) gas and ammonia gas as the source gases. Subsequently, boron nitride spacers 156 with width of about 200 nm are formed by etching back the boron nitride film by an RIE using boron trichloride ($BCl_3$) gas as the etching gas. Note that the embodiment does not have the silicon nitride film 190 as shown in FIG. 1.

The reason for constructing the insulating film layer 110B by an undoped silicon oxide film, is to avoid an increase in the relative dielectric constant (3.4) of the boron nitride spacers 156 due to diffusion of the phosphorus impurity from the BPSG film into the boron nitride spacers 156.

In a case of L=0.5 μm and W=10 μm, the fringe capacity between the gate electrode and the drain region is smaller about 10% than that of the conventional LDD transistor. When this transistor is employed to construct a CMOS inverter together with a P-channel transistor with L=0.5 μm and W=15 μm, the delay time is reduced by about 7%. In comparison to the case of the first embodiment, both the degree of reduction in the fringe capacity and the degree of reduction in $t_{pd}$ of the CMOS inverter are smaller. However, the adoption of this embodiment has another effect in that the nonuniformity in the fringe capacity becomes extremely small due to the fact that the width of the boron nitride spacers 156 can be formed with a high precise dimensions.

Analogous to the case of the first embodiment, this embodiment can also be applied to a P-channel field-effect transistor.

As described in the above, in this invention, the first spacers consisting of the silicon oxide film are used as the mask of ion implantation to form the source and the drain regions and removed after the implantation, and the second spacers consisting of an insulating material having a relative dielectric sonstant smaller than that of silicon oxide are formed over the side faces of the gate electrode. Because of this, there are obtained field effect transistors with no fluctuations in the transistor characteristics, and has a small fringe capacity as a result of adoption of this invention.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the described claims will cover any modifications of embodiments as fall within the true scope of the invention.

What is claimed is:

1. A method for fabricating a field effect transistor comprising the steps of:

forming a gate insulating film on a semiconductor substrate;

forming a gate electrode on said gate insulating film, said gate electrode having a top surface and a pair of side surfaces;

forming lightly-doped source and drain regions in said semiconductor substrate by introducing impurities into said semiconductor substrate by using said gate electrode as a mask;

covering said gate electrode with a first insulating film, said first insulating film thereby having a first portion on said top surface of said gate electrode and second and third portions respectively on said pair of side surfaces of said gate electrode, forming first and second sidewall spacers respectively on said second and third portions of said first insulating film;

forming heavily-doped source and drain regions into said semiconductor substrate by introducing impurities into said semiconductor substrate by using said first and second sidewall spacers, said first insulating film and said gate electrode as a mask;

subjecting said first and second sidewall spacers to an etchant to remove said first and second sidewall spacers, said first insulating film protecting said gate insulating film against said etchant; and forming third and fourth sidewall spacers respectively on said second and third portions of said first insulating film, each of said third and fourth sidewall spacers having a dielectric constant lower than that of a silicon oxide film.

2. The method as claimed in claim 1, wherein each of said third and fourth sidewall spacers is made of polyimide.

3. The method as claimed in claim 2, further comprising a step of forming a second insulating film on said third and fourth sidewall spacers to protect said third and fourth sidewall spacers.

4. The method as claimed in claim 3, wherein said second insulating film is a silicon nitride film.

5. The method as claimed in claim 1, wherein each of said third and fourth sidewall spacers is made of boron nitride.

6. The method as claimed in claim 5, further comprising a step for an inter-layer insulating film to cover said third and fourth sidewall spacers and said first insulating film, said inter-layer insulating film being an undoped silicon oxide film.

7. A method for fabricating a field effect transistor comprising the steps of:

forming a gate insulating film on a semiconductor substrate;

forming a gate electrode on said gate insulating film, said gate electrode having a top surface and a pair of side surfaces;

forming lightly-doped source and drain regions by introducing impurities into said semiconductor substrate by using said gate electrode as a mask;

covering said gate electrode with a first insulating film, said first insulating film thereby having a first portion on said top surface of said gate electrode and second and third portions respectively on said pair of side surfaces of said gate electrode, said first insulating film including a first silicon oxide film and a first silicon nitride film formed on said first silicon oxide film;

forming first and second silicon oxide sidewall spacers respectively on said second and third portions of said first insulating film;

forming heavily-doped source and drain regions by introducing impurities into said semiconductor substrate by using said first and second silicon oxide sidewall spacers, said first insulating film and said gate electrode as a mask;

removing said first and second sidewall spacers while protecting said first silicon oxide film in said first insulating film and said gate insulating film by said first silicon nitride film in said first insulating film;

forming first and second polyimide sidewall spacers on said second and third portions of said first insulating film;

covering said first and second polyimide sidewall spacers with a second silicon nitride film;

forming an inter-layer insulating layer on said second silicon nitride film.

8. The method as claimed in claim 7, wherein said inter-layer insulating layer is a boron-phosphor silicate glass.

9. A method for fabricating a field effect transistor comprising the steps of:

forming a gate insulating film on a semiconductor substrate;

forming a gate electrode on said gate insulating layer, said gate electrode having a top surface and a pair of side surfaces;

forming lightly-doped source and drain regions by introducing impurities into said semiconductor substrate by using gate electrode as a mask;

covering said gate electrode with a first insulating film, said first insulating film thereby having a first portion on said top surface of said gate electrode and second and third portions respectively on said pair of side surfaces of said gate electrode, said first insulating film including a first silicon oxide film and a first silicon nitride film formed on said first silicon oxide film;

forming first and second silicon oxide sidewall spacers respectively on said second and third portions of said first insulating film;

forming heavily-doped source and drain regions by introducing impurities into said semiconductor substrate by using said first and second silicon oxide sidewall spacers, said first insulating film and said gate electrode as a mask;

removing said first and second sidewall spacers while protecting said first silicon oxide film in said first insulating film and said gate insulating film by said first silicon nitrode film in said first insulating film;

forming first and second boron nitride sidewall spacers on said second and third portions of said first insulating film; and forming an inter-layer insulating layer on said first and second boron nitride sidewall spacers and said first insulating film.

10. The method as claimed in claim 9, said inter-layer insulating film is an undoped silicon oxide.

* * * * *